United States Patent
Keh et al.

(10) Patent No.: US 7,649,161 B2
(45) Date of Patent: Jan. 19, 2010

(54) LIGHT SOURCE UTILIZING LIGHT PIPES FOR OPTICAL FEEDBACK

(75) Inventors: Kean Loo Keh, Penang (MY); Lig Yi Yong, Penang (MY); Yoke Peng Boay, Penang (MY)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 94 days.

(21) Appl. No.: 11/744,109

(22) Filed: May 3, 2007

(65) Prior Publication Data

US 2008/0272319 A1 Nov. 6, 2008

(51) Int. Cl.
*G01J 1/32* (2006.01)
(52) U.S. Cl. .............. 250/205; 250/228; 362/240; 362/555
(58) Field of Classification Search .......... 250/205, 250/228, 227.11, 578.1; 362/231, 240, 555, 362/583, 612; 315/291, 308
See application file for complete search history.

(56) References Cited

U.S. PATENT DOCUMENTS

2005/0200315 A1* 9/2005 Kwong et al. .............. 315/308

* cited by examiner

*Primary Examiner*—Kevin Pyo

(57) ABSTRACT

A light source having a first mixing chamber, a light pipe structure, and a controller is disclosed. The first mixing chamber includes a first plurality of LEDs, the first mixing chamber having a first transparent window through which light from the first plurality of LEDs exits the first mixing chamber. The light pipe structure has a first end optically coupled to the window such that light from the first plurality of LEDs enters the first end and a second end through which the light exits. The controller determines the power that is applied to the first plurality of LEDs and includes a photodetector optically coupled to the second end of the light pipe structure. The photodetector generates signals indicative of an intensity of light generated by the LEDs, the controller causing the LEDs to be powered such that the signal matches a target value.

22 Claims, 3 Drawing Sheets

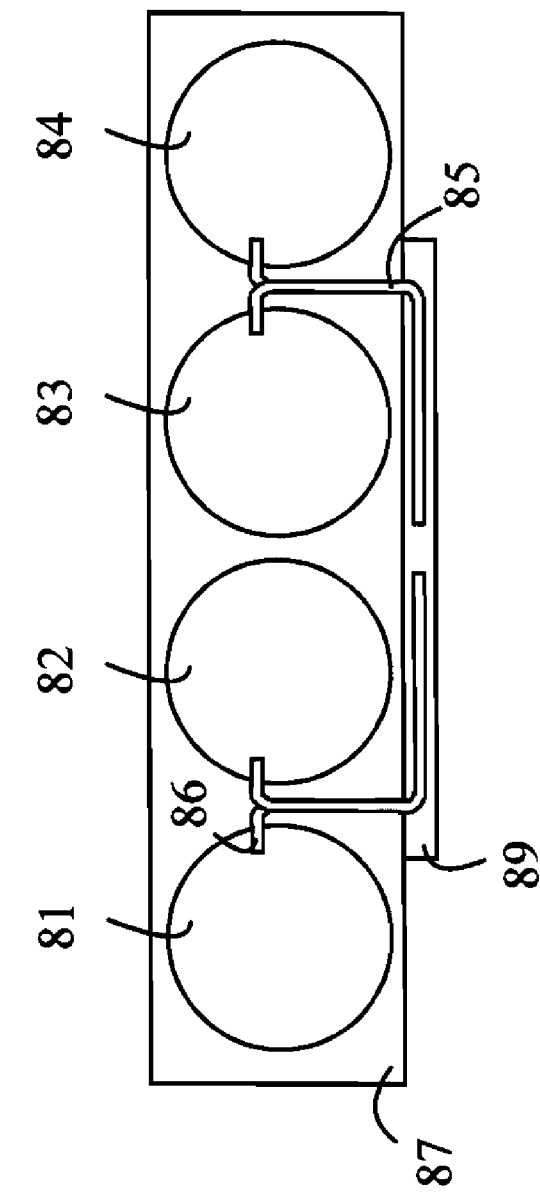
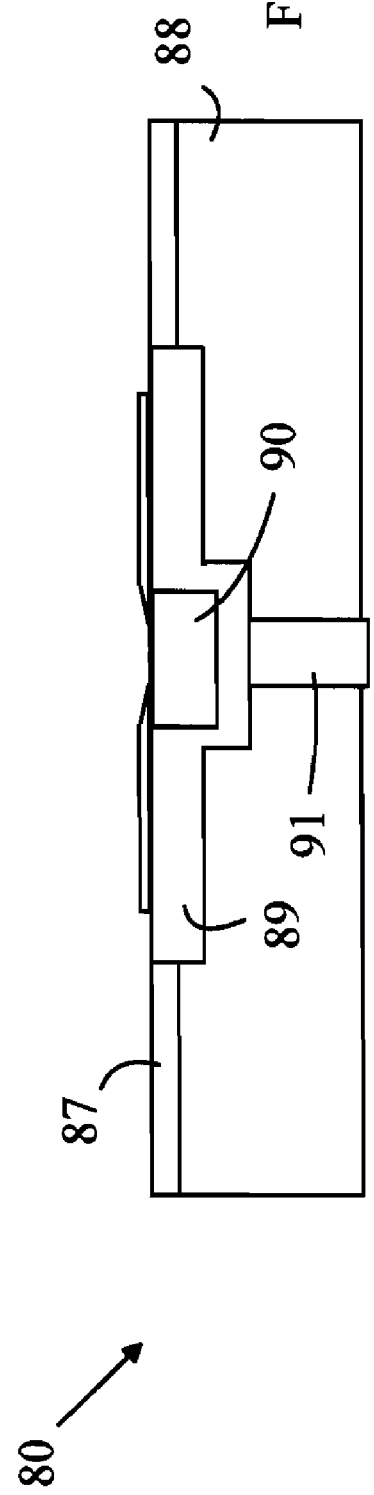

LIGHT SOURCE UTILIZING LIGHT PIPES FOR OPTICAL FEEDBACK

BACKGROUND OF THE INVENTION

Light-emitting diodes (LEDs) are attractive replacement candidates for conventional light sources based on incandescent bulbs and fluorescent light tubes. LEDs have higher energy conversion efficiency than incandescent lights and substantially longer lifetimes than both incandescent and fluorescent light fixtures. In addition, LED-based light fixtures do not require the high voltages associated with fluorescent lights.

Unfortunately, LEDs have other problems that must be overcome before LED-based lighting units can replace conventional lighting units. For example, LEDs age over time such that the light output for a given current decreases with time. To compensate for this aging, feedback loops are often utilized in which a photodiode is incorporated with the LED to measure the light output from the LED. The signal from the photodiode is utilized by a servo loop to alter the average current through the LED such that the light output from the LED remains constant.

When a light source is constructed from multiple LEDs, the placement of the light sensor for the feedback loop becomes problematic. The individual LEDs are distributed over a finite area within the light source; hence, the light will only appear to have the desired color at locations that are at a distance from the LEDs that is large compared to the maximum distance between the LEDs so that the light is well mixed at the viewing location. Alternatively, a mixing cavity of some type is provided to mix the light such that light leaving the cavity is well mixed. The light sensor must be located at a point at which the light from the individual LEDs has been sufficiently mixed to provide the desired color. Hence, there can be a significant distance between the individual LEDs and the point at which the light is sampled to provide the signals for the servo loop even within a single light source. The problems are more severe in lighting systems that involve multiple light sources that target different physical areas for illumination, since there is no longer a single point at which light from all of the light sources is uniformly mixed.

In general, the photodetectors used to monitor the light from the LEDs are preferably located on the same die as the controller that executes the servo loop and the drivers used to power the individual LEDs. In light sources having multiple target areas, a separate controller chip must be used for each target area, which increases the cost of the light source. Further, the size of the die is much larger than the size of the photodiodes; hence, a significant area of the light path can be blocked by the controller die, which possesses significant design, as well as efficiency, problems in some applications.

SUMMARY OF THE INVENTION

The present invention includes a light source having a first mixing chamber, a light pipe structure, and a controller. The first mixing chamber includes a first plurality of LEDs, the first mixing chamber having a first transparent window through which light from the first plurality of LEDs exits the first mixing chamber. The light pipe structure has a first end optically coupled to the window such that light from the first plurality of LEDs enters the first end and a second end through which the light exits. The controller determines the power that is applied to the first plurality of LEDs and includes a photodetector optically coupled to the second end of the light pipe structure. The photodetector generates signals indicative of an intensity of light generated by the LEDs, the controller causing the LEDs to be powered such that the signal matches a target value. In one aspect of the invention, the controller and the photodetector are part of a single integrated circuit chip. The light pipe structure can be part of the transparent window or a separate part in which the first end is bonded to the transparent window. In another aspect of the present invention, the light source includes additional mixing chambers and the light pipe structure includes additional light pipe ends that are bonded to transparent windows associated with the additional mixing chambers.

BRIEF DESCRIPTION OF THE DRAWINGS

FIG. 4 is a top view of a light source according to another embodiment of the present invention.

FIG. 5 is a side view of the light source shown in FIG. 4.

DETAILED DESCRIPTION OF THE PREFERRED EMBODIMENTS OF THE INVENTION

Figure 2:
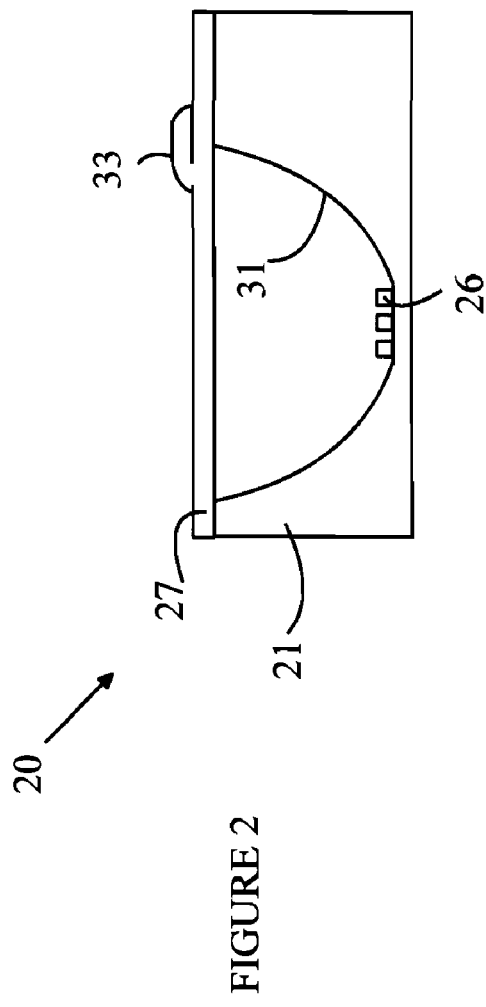
FIG. 2 is a cross-sectional view through line 2-2 shown in FIG. 1.
Figure 1:
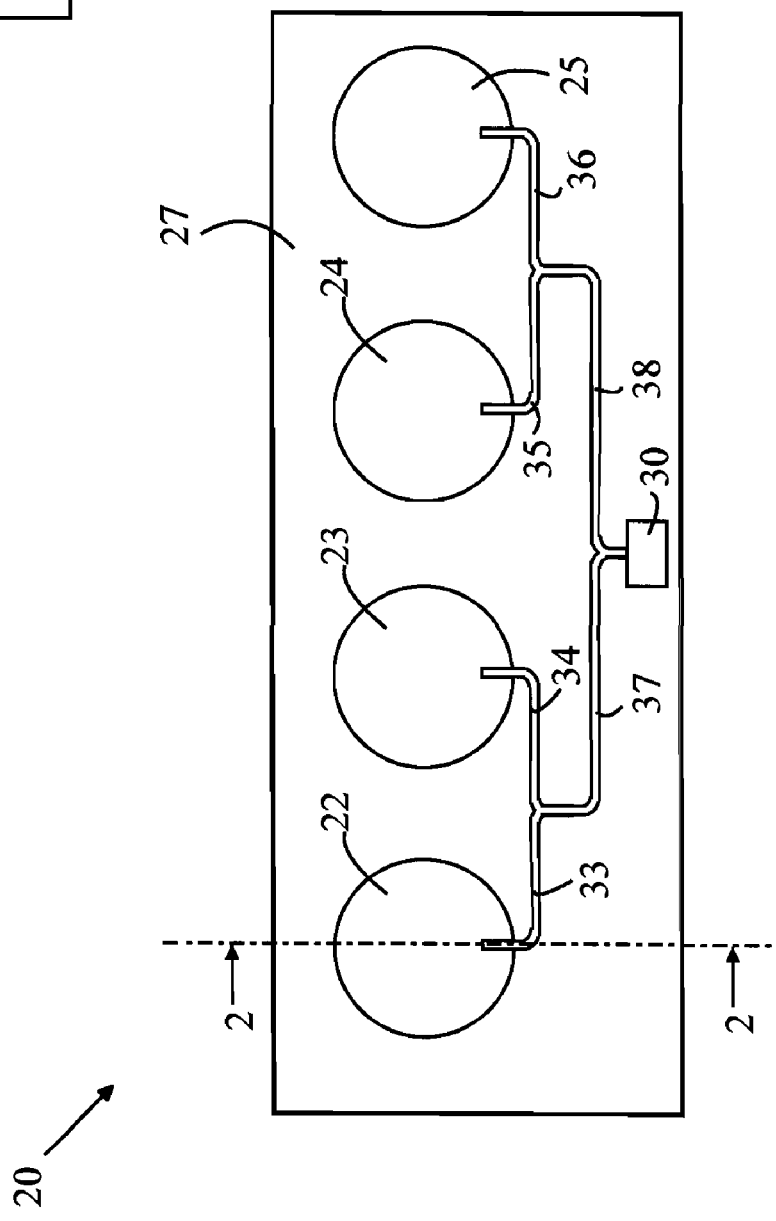
FIG. 1 is a top view of a light source according to one embodiment of the present invention.

The manner in which the present invention provides its advantages can be more easily understood with reference to FIGS. 1 and 2, which illustrate one embodiment of a light source according to the present invention. FIG. 1 is a top view of light source 20, and FIG. 2 is a cross-sectional view through line 2-2 shown in FIG. 1. Light source 20 includes 4 separate component light sources 22-25. Each component light source includes a plurality of LED dies 26 mounted in a housing 21 having a mixing chamber 31. The mixing chamber typically has reflective walls. The walls can be shaped to provide optical processing of the light from the LEDs. For example, the wall could form a parabolic reflector that collimates the light. The housing is covered by a plate 27 that could include structures and/or materials that alter the light leaving the mixing chamber. Such structures could include lenses, scattering structures, dyes or luminescent materials. In one embodiment, plate 27 is a molded plastic structure.

Plate 27 also includes a light pipe structure that includes light pipes 33-38. In one embodiment, the light pipes are molded into plate 27 when the plate is formed. One end of each light pipe terminates on plate 27 over one of the mixing chambers. The end in question receives light from the mixing chamber at a location at which the light is well mixed. Hence, the light signal transferred by that light pipe is an accurate sample of the light in the mixing chamber.

The light signals leaving the other ends of the light pipes are collected by light pipes 37 and 38 and routed to a sensor die 30 that includes the photosensors used to monitor the light output and the controller that provides the driving signals to each of the LEDs. The connections from sensor die 30 to the individual LEDs are made by conductors that are part of housing 21. To simplify the drawing, these connections have been omitted.

The photosensors in die 30 are typically photodiodes. The number of photodiodes depends on the particular algorithm used to control the average current in the LED dies. In some cases, the LEDs are grouped into groups that emit light having the same output spectrum and that are driven by a common drive signal. The individual LEDs can be driven in parallel or in series by this drive signal. Series connections are often preferred because all of the LEDs are then driven with the same current even if one of the LEDs ages. Groups of LEDs are used in situations in which the required light output in the spectrum in question is more than a single LED can provide. To simplify the following discussion, each group of LEDs that is driven by a common drive signal will be referred to as a control group. The smallest control group has one LED.

The average current can be controlled either by applying a DC signal to each LED or control group and varying the magnitude of that signal. Alternatively, the drive signal can be an AC signal in which the average current is controlled by controlling the duty factor of the signal, i.e., the fraction of each period during which the signal is on.

In the simplest sensor, a single photodiode that is sensitive to light from all of the LED dies is utilized. The light output from each control group is measured separately in this type of system by turning that control group on and turning the remaining control groups off. The LEDs can be turned on and off in very short time periods without a human observer being aware of the flashing nature of the light source.

Further, the number of intensity measurements that need to be made to correct for aging effects represents a relatively small fraction of the time during which the light source is turned on. For example, the light output of the LEDs could be sampled once at the time the light source is turned on, and the drive signals adjusted so that the photodiode output matches a target value. Once the light source has been operating long enough to warm up, a second measurement could be made and the drive currents adjusted accordingly.

In another embodiment, multiple photodiodes that sample the light in different spectral bands are utilized. In this case, the output from different control groups can be measured simultaneously if the control groups in question emit light having spectra that can be distinguished by the photodiodes. Such sensors typically utilize photodiodes that are covered with dye filters to provide the selective wavelength responses.

Figure 3:
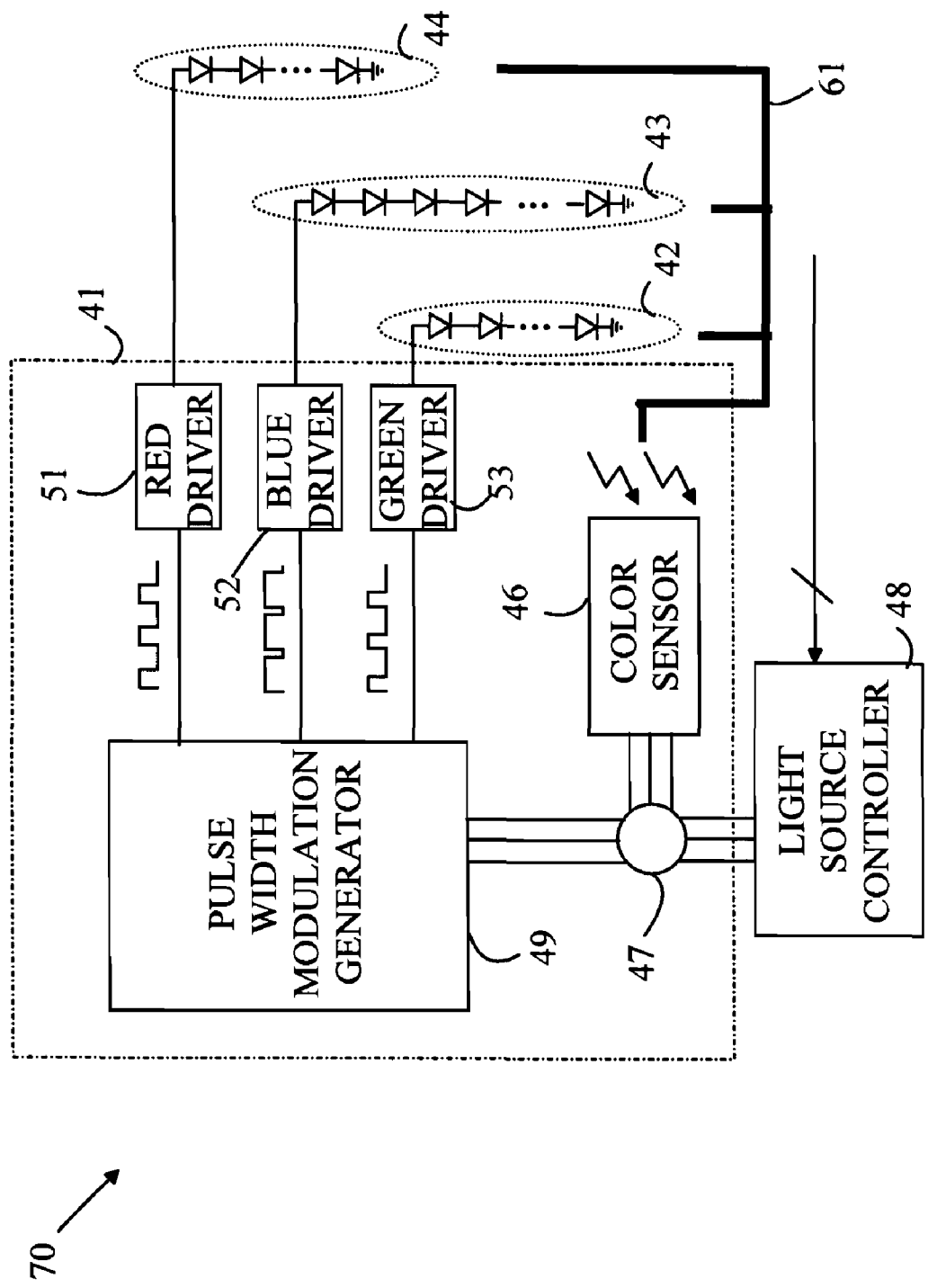
FIG. 3 illustrates an embodiment of a light source according to the present invention that utilizes a conventional RGB controller.

Refer to FIG. 3, which illustrates one embodiment of a light source according to the present invention that utilizes a conventional RGB controller. Light source 70 includes three control groups of LEDs. The control groups consist of red, blue, and green emitting sets of LEDs shown at 42-44, respectively. The current through each of the control groups is controlled by a color controller 41. Color controller 41 includes a color sensor 46 that measures the light generated by all three sets of LEDs. Color sensor 46 receives light from a light pipe structure 61 which is similar to the light pipe structure described above.

Color sensor 46 generates signals indicative of the intensity of light received by color sensor 46 in the optical bands around red, blue, and green. Color sensor 46 could be constructed from a set of three photodiodes in which each photodiode has a corresponding bandpass filter that limits the light reaching that photodiode to light in one of the optical bands in question. However, many other forms of color sensor are known to the art and could be utilized.

The outputs of color sensor 46 are compared to target color values that are generated off of the chip that contains color controller 41. In light source 70, these signals are stored in a light source controller 48 and selected by input from the user. The user input can include both a color point and intensity value. The color point can be selected by specifying one of a predetermined set of preprogrammed color points.

Comparator 47 outputs error signals that are utilized to adjust the average current through LED sets 42-44 utilizing pulse width modulation generator 49. The LEDs are turned on and off at a rate that is too fast for the human eye to perceive. The observer sees only the average light generated by the LEDs. The average current through the LEDs is set by setting the percentage of the time in each cycle that the LEDs are on. Pulse width modulation generator 49 adjusts the duty factor for each set of LEDs to minimize the error signals. A set of current drivers 51-53 provides the current to each set of LEDs.

In yet another embodiment, the various control groups can be modulated at different frequencies. As noted above, a human observer will not be able to observe the modulation if the frequency is sufficiently high. However, the signal from the photodiode will show a similar modulation. If each group is modulated with a different frequency, the output of the photodiode can be filtered to provide measurement signals corresponding to each control group.

It should be noted that a light source according to the present invention can be fabricated using a number of components that are already utilized by light sources based on incandescent lamps. One conventional lighting arrangement that utilizes small incandescent bulbs incorporates the bulbs into a fixture that includes a reflector and a lens that images the light source in a manner that depends on the particular application. The lens can also be replaced by a color filter in such light sources. In the case of a light source that is designed to provide a spot light having an adjustable color point, three of these conventional light sources in which each source utilizes a different color can be combined such that the desired color is obtained by varying the power to the individual light bulbs.

LEDs are essentially point sources, and hence, are ideally suited for replacing small conventional incandescent light bulbs in light sources such as the one described above. Since LEDs are available in the desired color bands, the conventional color filters and the losses associated therewith can be avoided. There is a considerable investment in the manufacturing of the fixtures in which these conventional light bulbs are utilized. In the case of existing lighting systems based on these fixtures, a retrofit is needed to provide the modifications with the minimum alteration in the fixtures, since the cost of replacing the existing fixtures is prohibitive in many cases. For new light fixtures, the alterations in the design of the fixtures should be as small as possible to preserve the manufacturing investment that is already in place for making such fixtures.

The light pipe structure of the present invention can provide the retrofit mechanism in many cases. As noted above, these conventional fixtures often include a cover plate that is analogous to plate 27 described above. Hence, by replacing the conventional incandescent bulbs with an LED light source having one or more closely spaced dies and replacing the conventional cover plate with one having a light pipe structure according to the present invention and adding a servo control chip such as chip 30 described above, the conventional light source can be converted to an LED light source.

It should also be noted that the light pipe structure can be separate from the cover plate. In another embodiment of the present invention that is adapted for retrofitting a conventional light source, the light pipe structure is a separate molded structure that is bonded to the conventional light source housing. Refer now to FIGS. 4 and 5, which illustrate another embodiment of a light source according to the present invention. FIG. 4 is a top view of light source 80, and FIG. 5 is a side view of light source 80. Light source 80 is similar to light source 20 discussed above in that light source 80 includes 4 component light sources 81-84 that include mixing chambers and a window in cover plate 87. The light leaving the windows is sampled by a light pipe structure 85 that includes a plurality of receiving ports 86, one per component light source. The receiving ports are bonded to the windows using an optically transparent bonding agent such as an epoxy. The light pipe structure transports the sampled light to a controller 90 that includes a photodetector that measures the light leaving the light pipe structure and provides the appropriate control signals to the LED dies within the component light sources via a cable 91. The light pipe structure and controller are included in an adapter 89 that is bonded to a side surface of body 88. The thickness of the adapter need only be sufficient to contain the ends of the light pipe and the controller chip. Hence, the resultant light source has very similar dimensions to the conventional light source that utilized housing 88 and cover plate 87. Thus, the housing for a conventional incandescent bulb light source can be easily converted to an LED-based light source.

Various modifications to the present invention will become apparent to those skilled in the art from the foregoing description and accompanying drawings. Accordingly, the present invention is to be limited solely by the scope of the following claims.

What is claimed is:

1. A light source comprising:
    a first mixing chamber comprising a first plurality of LEDs, said first mixing chamber having reflective walls and a primary opening formed at a top area of the first mixing chamber that is covered by a first transparent window plate through which light from said first plurality of LEDs exists exits said first chamber, wherein color shift or intensity change occurs as light from said first plurality of LEDs passes through said transparent window plate;
    a light pipe structure having a first end optically coupled to said transparent window plate such that light from said first plurality of LEDs that passed through said transparent window plate enters said first end, said light pipe having a second end through which said light exits; and
    a controller that determines the power applied to said first plurality of LEDs, and a photodetector optically coupled to said second end, said photodetector generating signals indicative of an intensity of light generated by said LEDs, said controller causing said LEDs to be powered such that said signal matches a target value.

2. The light source of claim 1 wherein said controller and said photodetector are part of a single integrated circuit chip.

3. The light source of claim 1 wherein said first transparent window and said light pipe structure are part of a single molded structure.

4. The light source of claim 1 wherein said first end is bonded to said first window.

5. The light source of claim 1 further comprising a second mixing chamber comprising a second plurality of LEDs, said second mixing chamber having a second transparent window through which light from said second plurality of LEDs exits said second mixing chamber, said light pipe structure comprising a third end that is optically coupled to said second transparent window, light from said second mixing chamber entering said third end and exiting said second end.

6. The light source of claim 1 wherein said LEDs comprise LEDs that emit light in different optical bands from one another.

7. The light source of claim 1 wherein said first mixing chamber comprises a cavity having reflective walls.

8. The light source of claim 7 wherein said mixing chamber comprises a parabolic reflector.

9. The light source of claim 1 wherein a first LED in said first plurality of LEDs generates light in a different spectral band than a second LED in said first plurality of LEDs and wherein said controller determines an intensity of light generated by said first LED and separately determines an intensity of light generated by said second LED.

10. The light source of claim 9 wherein said controller separately controls said first and second LEDs to maintain said determined intensities at first and second intensity values.

11. A method for illuminating an object, said method comprising:
    providing a first mixing chamber comprising a first plurality of LEDs, said first mixing chamber having reflective walls and a primary opening formed at a top area of the first mixing chamber that is covered by a first transparent window plate through which light from said first plurality of LEDs exits said first mixing chamber, wherein color shift or intensity change occurs as light from said first plurality of LEDs passes through said transparent window plate, said LEDs generating light at an intensity determined by a control signal;
    providing a light pipe structure having a first end optically coupled to said transparent window plate such that light from said first plurality of LEDs that passed through said transparent window plate enters said first end and a second end through which said light exits; and
    measuring a first intensity of light leaving said second end of said light pipe and adjusting said control signal to maintain said measured first intensity at a predetermined level.

12. The method of claim 11 wherein a first one of said first plurality of LEDs generates light in a different spectral band than a second one of said first plurality of LEDs and wherein said control signal separately controls said first and second ones of said LEDs.

13. The method of claim 12 wherein intensities of light in at least two spectral bands are measured to adjust said control signal.

14. The method of claim 11 further comprising:
    providing a second mixing chamber comprising a second plurality of LEDs, said second mixing chamber having a second transparent window through which light from said second plurality of LEDs exits said second mixing chamber, said light pipe structure comprising a third end that is optically coupled to said second transparent window, light from said second mixing chamber entering said third end and exiting said second end;
    separately measuring a second intensity of light from said second plurality of LEDs at said second end of said light pipe; and
    separately controlling said second plurality of LEDs to maintain said separately measured second intensity at a predetermined level.

15. The method of claim 14 wherein said first plurality of LEDs comprises LEDs that emit light in a different optical band from said second plurality of LEDs.

16. A method of retrofitting a light source having a mixing chamber in which a light source is placed and having reflective walls and a primary opening formed at a top area of the first mixing chamber that is covered by a transparent window plate through which light from said light source exits, said method comprising:
    replacing said light source with a light source comprising a plurality of LEDs, wherein color shift or intensity change occurs as light from said plurality of LEDs passes through said transparent plate;
    proving a light pipe structure having a first end that is bonded to said transparent window plate, light from said mixing chamber that passed through said transparent window plate entering said first end and exiting a second end of said light pipe structure;

positioning a photodetector to receive said light leaving said second end, said photodetector generating a signal indicative of an intensity of light generated by said LEDs; and providing a controller that controls said plurality of LEDs such that said signal is maintained at a target value.

17. The method of claim 16 wherein said photodetector and said controller are part of a single integrated circuit chip.

18. The method of claim 16 wherein said first end is bonded to said transparent window with a transparent adhesive.

19. The method of claim 16 wherein said transparent window is replaced by a premolded structure having a new transparent window coupled to said first end.

20. The method of claim 16 wherein said light pipe comprises a premolded structure that is separate from said transparent window.

21. The method of claim 11 wherein said first transparent window and said light pipe structure are part of a single molded structure.

22. The Method of claim 11 wherein said first end is bonded to said first window.

* * * * *